(12) United States Patent
Ishikawa et al.

(10) Patent No.: US 9,190,263 B2
(45) Date of Patent: Nov. 17, 2015

(54) METHOD FOR FORMING SIOCH FILM USING ORGANOAMINOSILANE ANNEALING

(71) Applicant: ASM IP Holding B.V., Almere (NL)

(72) Inventors: Dai Ishikawa, Ome (JP); Kiyohiro Matsushita, Fuchu (JP); Akinori Nakano, Ota-ku (NL); Shintaro Ueda, Tama (JP); Hirofumi Arai, Sagamihara (JP)

(73) Assignee: ASM IP Holding B.V., Almere (NL)

( * ) Notice: Subject to any disclaimer, the term of this patent is extended or adjusted under 35 U.S.C. 154(b) by 350 days.

(21) Appl. No.: 13/973,777

(22) Filed: Aug. 22, 2013

(65) Prior Publication Data

US 2015/0056821 A1    Feb. 26, 2015

(51) Int. Cl.
  *H01L 21/31* (2006.01)
  *H01L 21/469* (2006.01)
  *H01L 21/02* (2006.01)
  *H01L 21/67* (2006.01)

(52) U.S. Cl.
  CPC ...... *H01L 21/02126* (2013.01); *H01L 21/0234* (2013.01); *H01L 21/02216* (2013.01); *H01L 21/02271* (2013.01); *H01L 21/02274* (2013.01); *H01L 21/02323* (2013.01); *H01L 21/02337* (2013.01); *H01L 21/02348* (2013.01); *H01L 21/67115* (2013.01); *H01L 21/67207* (2013.01)

(58) Field of Classification Search
  CPC ............ H01L 21/02126; H01L 21/02216; H01L 21/02348
  See application file for complete search history.

(56) References Cited

U.S. PATENT DOCUMENTS

| | | | |
|---|---|---|---|
| 5,028,366 A | 7/1991 | Harakal et al. | |
| 5,601,641 A | 2/1997 | Stephens | |
| 5,827,757 A | 10/1998 | Robinson, Jr. et al. | |
| 6,531,412 B2 | 3/2003 | Conti et al. | |
| 6,895,158 B2 | 5/2005 | Aylward et al. | |
| 6,939,817 B2 | 9/2005 | Sandhu et al. | |
| 7,084,079 B2 | 8/2006 | Conti et al. | |
| 7,265,061 B1 | 9/2007 | Cho et al. | |
| 7,326,657 B2 | 2/2008 | Xia et al. | |
| 7,541,297 B2 | 6/2009 | Mallick et al. | |
| 7,582,555 B1 | 9/2009 | Lang et al. | |
| 7,790,633 B1 | 9/2010 | Tarafdar et al. | |
| 7,803,722 B2 | 9/2010 | Liang | |
| 7,851,232 B2 | 12/2010 | van Schravendijk et al. | |
| 7,897,215 B1 | 3/2011 | Fair et al. | |
| 8,003,174 B2 | 8/2011 | Fukazawa | |
| 8,143,174 B2 | 3/2012 | Xia et al. | |
| 8,242,031 B2 | 8/2012 | Mallick et al. | |
| 9,029,272 B1 * | 5/2015 | Nakano ............ H01L 21/02126 438/424 |
| 2011/0034039 A1 | 2/2011 | Liang et al. | |

FOREIGN PATENT DOCUMENTS

WO    2007140376    12/2007

* cited by examiner

*Primary Examiner* — Bac Au
(74) *Attorney, Agent, or Firm* — Snell & Wilmer LLP

(57) ABSTRACT

A method for forming a modified low-k SiOCH film on a substrate, includes: providing a low-k SiOCH film formed on a substrate by flowable CVD; exposing the low-k SiOCH film to a gas containing a Si—N bond in its molecule without applying electromagnetic energy to increase Si—O bonds and/or Si—C bonds in the film; and then curing the low-k SiOCH film.

15 Claims, 7 Drawing Sheets

METHOD FOR FORMING SIOCH FILM USING ORGANOAMINOSILANE ANNEALING

BACKGROUND OF THE INVENTION

1. Field of the Invention

The present invention generally relates to a method for forming a carbon-doped silicon oxide (SiOCH) film on a substrate, particularly to a method for forming a SiOCH film modified by organoaminosilane annealing, for example.

2. Description of the Related Art

With miniaturization of wiring pitch of large scale integration (LSI) devices, signal delay due to the resultant increased wiring capacitance has become a problem. In order to reduce the wiring capacitance, attempts to reduce the dielectric constant of interlayer films have been implemented, and as a result, porous SiOCH films having pores in the films have been utilized.

Recently, instead of the damascene process used for conventional Cu wiring, a process of forming metal wires and embedding low-K film (e.g., a SiOCH film) between them is considered. For the process, a method of forming highly flowable film at a low temperature is required.

In forming flowable low-k film, it is necessary to remove alcohol and hydrocarbon included in the film after film formation by conducting curing such as UV or thermal annealing so as to form strong Si—O bonds. Flowable low-k films include large quantities of hydrocarbons, alcohols, unreacted precursors, and Si—OH bonds. Due to the occurrence of desorption or cross-linkage of these components during curing, extensive film shrinkage occurs. As a result, because voids are generated in the film which is embedded in trenches with a narrow pitch, the functionality of the insulating film is lost, which becomes a problem.

Additionally, if, in order to improve stability of the film, the duration of UV light curing is prolonged, film shrinkage progresses more, and it may result in disconnection of wires, collapse of wires, and cracking of the film. Thus, technology which enables a reduction of film shrinkage is in great demand for improving the film quality.

Any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

In some embodiments, after depositing a low-k film (such as SiOCH film) having high flowability, the film is subjected to a step of exposing the film to a reactive gas (such as organoaminosilane) which is reactive to —OH groups. Since highly flowable SiOCH film contains many unstable groups (such as alcohol groups, hydroxyl groups), by introducing the above gas, the unstable groups can be replaced with stable Si-Me groups or Si—O bonds can be formed via organoaminosilane, thereby reducing the amount of components which are disassociated and removed during a curing step and strengthening the skeleton including Si—O bonds, and as a result, increasing the quantity of components including Si—O bonds, suppressing shrinkage of film, and increasing the film strength.

In addition, in some embodiments, prior to or after exposing the film to the reactive gas, by adding an oxidizing step where the film is exposed to an oxidizing atmosphere to form silanol (Si—OH), followed by an organoaminosilane exposure step, the quantity of components including Si—O bonds can be increased, thereby further suppressing the film shrinkage and increasing the film strength.

In some embodiments, in the oxidizing step, by using an oxygen plasma, an ozone generator, and/or UV light irradiation in an oxidizing atmosphere to generate ozone, etc., the film can be oxidized.

The above oxidizing step and the exposure step can be conducted once or repeated multiple times.

The resultant film can be modified by using a subsequent thermal annealing step and a subsequent curing step using UV light until the film exhibits desired strength.

In another aspect, for further reducing thermal shrinkage of film and assuring stability of film quality, a substrate is processed in clustered chambers for conducting formation of low-k film, annealing, and UV curing, in which the substrate on which a low-k film is formed is transferred continuously to an annealing chamber in an inert gas atmosphere. By this, the substrate is subjected to annealing without being exposed to the air, thereby inhibiting changes of film quality caused by oxidation and moisture absorption. Further, constant time management between different processes (Q-time control) can be performed, and thus, changes of film quality due to thermal shrinkage in the chamber can be controlled under the constant time management, thereby producing films with low variations between substrates.

In still another aspect, by conducting an oxidizing step using a remote plasma unit prior to the organoaminosilane exposure step, elastic modulus of film can significantly be improved.

In yet another aspect, by conducting two-step UV-curing (low-temperature UV-curing and high-temperature UV-curing), film shrinkage can further be reduced.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENT

Figure 1:
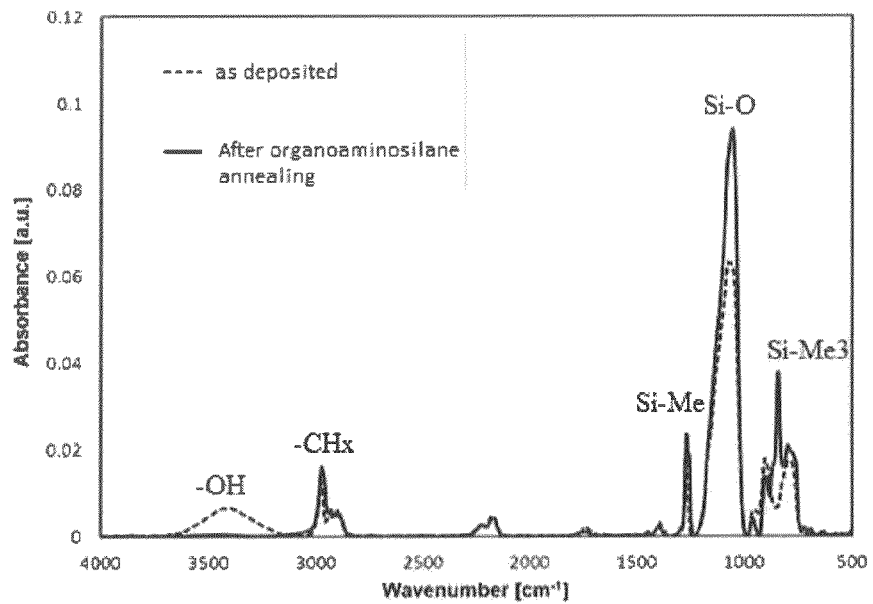
FIG. 1 shows Fourier Transform Infrared (FTIR) spectra of a carbon-doped silicon oxide film formed with organoaminosilane annealing according to an embodiment of the present invention (solid line) and a carbon-doped silicon oxide film formed without organoaminosilane annealing (broken line).

In this disclosure, "gas" may include vaporized solid and/or liquid and may be constituted by a single gas or a mixture of gases. Likewise, an article "a" or "an" refers to a species or a genus including multiple species. In this disclosure, a process gas introduced to a reaction chamber through a showerhead or gas inlet port is a gas used for treating a substrate and may be comprised of, consist essentially of, or consist of a silicon-containing gas and a carrier gas such as a rare gas. A gas other than the process gas, i.e., a gas introduced without passing through the showerhead, may be used for, e.g., sealing the reaction space, which includes a seal gas such as a rare gas. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. Further, in this disclosure, any two numbers of a variable can constitute an workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

The embodiments will be explained with respect to preferred embodiments. However, the present invention is not limited to the preferred embodiments In some embodiments, a method for forming a modified low-k SiOCH film on a substrate, comprises:

(i) providing a low-k SiOCH film formed on a substrate by flowable CVD;

(ii) exposing the low-k SiOCH film to a gas containing a Si—N bond in its molecule to increase Si—O bonds and/or Si—C bonds in the film; and (iii) curing the low-k SiOCH film obtained in step (ii).

In this disclosure, "containing a Si—N bond" may refer to being characterized by a Si—N bond or Si—N bonds, having a main skeleton substantially constituted by a Si—N bond or Si—N bonds, and/or having a substituent substantially constituted by a Si—N bond or Si—N bonds. In this disclosure, "curing" refers to a process during which a chemical reaction (such as polymerization or crosslinking) and/or physical action (such as vaporization or removing volatile components) take(s) place, resulting in a harder, tougher, and/or more stable linkage of film matrix. In this disclosure, "annealing" refers to a process during which a material is treated to become its stable form, e.g., a terminal group (such as an alcohol group and hydroxyl group) present in a component is replaced with a more stable group (such as a Si-Me group) and/or forms a more stable form (such as a Si—O bond). In some embodiments, the curing and the annealing are defined as mutually exclusive processes. Typically in the annealing and the curing, substantially no film is formed on the substrate.

Step (ii) may be referred to as an annealing step, which is a discrete step separate from step (iii) wherein, in some embodiments, step (ii) is conducted without electromagnetic energy (energy in electromagnetic wavelengths) such as UV light irradiation and RF power application, whereas step (iii) is conducted with such electromagnetic energy without the gas containing a Si—N bond. If electromagnetic energy is applied in step (ii), shrinkage of a depositing film is likely to occur during step (ii) before step (iii). In step (ii), the quantity of hydroxyl groups may also be reduced. In some embodiments, in step (ii), the quantity of Si—O bonds increases, and volatile components of the film are replaced with non-volatile components. The volatile components include, but are not limited to, $H_2O$, alcohol such as methanol and ethanol, and short-chain silanol. The non-volatile components include, but are not limited to, long-chain siloxane, and alkylsiloxane bonded to a Si—O skeleton present in the film. The non-volatile components also include components which were volatile but become non-volatile by bonding to a Si—O skeleton present in the film. As a result of decreasing volatile components and increasing non-volatile components, the shrinkage of the resultant film can effectively be reduced.

The low-k SiOCH film is a dielectric film constituted by a matrix formed substantially by Si, O, C, and H and/or characterized substantially by Si, O, C, and H, with or without one or more other elements doped therein. The dielectric film may have a dielectric constant of about 1.9 to about 5.0, typically about 2.1 to about 3.5, preferably less than 2.5. In some embodiments, the dielectric film is formed in trenches or vias including side walls and bottom surfaces, and/or flat surfaces, by flowable CVD or any other equivalent thin film deposition methods. Typically, the thickness of the dielectric film is in a range of about 50 nm to about 500 nm (a desired film thickness can be selected as deemed appropriate according to the application and purpose of film, etc.). The flowable CVD process is a process to deposit by CVD a liquid-like film that flows substantially freely into gaps such as trenches and vias with a high aspect ratio (e.g., more than 1:2 or 1:5) and fills the gaps from their bottom substantially without voids (prior to curing).

In some embodiments, the gas containing a Si—N bond is a gas reactive to hydroxyl groups and contains an alkyl group. In some embodiments, the gas is an organoaminosilane, and the organoaminosilane may be one or more compounds selected from the group consisting of bisdiethylamino silane (BDEAS), bisdiethylamino methylsilane (BDEAMS), bisdiethylamino dimethylsilane (BDEADMS), bisdimethylaminosilane (BDMAS), bisdimethylamino methylsilane (BDMADMS), bisdimethylamino dimethylsilane (BDMADMS), bistert-butylaminosilane (BTBAS), dimethylamino trimethylsilane (DMATMS), dimethylamino dimethylsilane (DMADMS), diethylamino trimethylsilane (DEATMS), diethylamino dimethylsilane (DEADMS), tert-butylaminosilane (TBAS), tert-butylamino trimethylsilane (TBATMS), disec-butylaminosilane (DSBAS), trisdimethylaminosilane (TDMAS), trisdimethylaminomethylsilane (TDMAMS), bistrimethylsilylamine (BTMSA), bistrimethylsilylmethylamine (BTMSMA), bisdimethylsilylamine (BDMSA), bisdimethylsilylmethylamine (BDMSMA), tristrimethylsilylamine (TTMSA), trisdimethylsilylamine (TDMSA), and a derivative of the foregoing.

In some embodiments, the gas containing a Si—N bond is an organosilazane such as alkyl-substituted disilazane, alkyl-substituted trisilazane, alkyl-substituted tetrasilazane, alkyl-substituted polysilazane, alkyl-substituted silazane, alkyl-substituted cyclotrisilazane, alkyl-substituted cyclotetrasilazane, and a derivative of the foregoing. In some embodiments, organoaminosilanes refer to silane compounds containing Si—N bonds and hydrocarbons including organosilazanes.

In some embodiments, step (iii) comprises irradiating the low-k SiOCH film with UV light or heating low-k SiOCH film.

In some embodiments, steps (i) and (ii) are conducted continuously in a same chamber. In the above, "continuously" refers to without breaking a vacuum, without interruption as a timeline, or immediately thereafter, as a next step in some embodiments.

In some embodiments, step (ii) is conducted under conditions where the temperature of the substrate is controlled at about 0° C. to about 200° C. (typically about 0° C. to about 100° C.), the pressure is controlled at about 0.5 Pa to the standard atmospheric pressure (typically about 500 Pa to about 12000 Pa), the duration of step (ii) is about one second to about 60 minutes (typically about 1 minute to about 5 minutes), and the concentration of the gas containing a Si—N bond in the atmosphere to which the film is exposed is about 100 ppm to 100% (typically about 10% to about 100%) wherein an inert gas such as rare gas and/or nitrogen gas which is not reactive to the gas containing a Si—N bond can be used as an additive gas or a carrier gas. Once the gas containing a Si—N bond is loaded to the chamber where the substrate is placed, the gas need not be continuously supplied to the chamber throughout step (ii).

In some embodiments, the method further comprises, prior to or after step (ii), (iia) oxidizing the low-k SiOCH film provided in step (i) at a temperature substantially similar or equivalent to that in step (i). By adding the oxidization step, the quantity of Si—O bonds increases, thereby further reducing shrinkage of the film during step (iii). In some embodiments, steps (iia) and (ii) are repeated once or multiple times (e.g., 2 to 10 times, typically 2 to 5 times). Step (iia) may be performed using UV light irradiation in an oxidizing atmosphere, using a plasma containing oxygen, or using ozone.

In some embodiments, step (iia) (oxidizing step) is conducted using UV light irradiation under conditions where the atmosphere to which the substrate is exposed contains oxygen in a concentration of about 10 ppm to about 100% (typically about 50 ppm to about 5%), wherein an inert gas such as rare gas and/or nitrogen may be used as a carrier gas or an additive gas, the flow rate of oxygen is about 0.1 sccm to about 20 slm (typically about 2 sccm to about 200 sccm), wherein the total gas flow is about 100 sccm to about 20 slm (typically about 4 slm to about 10 slm), the temperature of the atmosphere is about 0° C. to about 100° C. (typically about 0° C. to about 50° C.), the pressure is about 1 Pa to about 1 ATM (typically about 500 Pa to about 12,000 Pa), and the duration of step (iia) is about one second to about 10 minutes (typically about 10 seconds to about 2 minutes).

In some embodiments, step (iia) (oxidizing step) is conducted using an ozone generator under conditions where the concentration of ozone supplied to the atmosphere to which the substrate is exposed is about 10 ppm to about 100% (typically about 1% to about 20%), wherein an inert gas such as rare gas and/or nitrogen may be used as a carrier gas or an additive gas, the total flow is about 100 sccm to about 20 slm (typically about 500 sccm to about 2 slm), the temperature of the atmosphere is about 0° C. to about 100° C. (typically about 0° C. to about 50° C.), the pressure is about 1 Pa to about 1 ATM (typically about 500 Pa to about 12,000 Pa), and the duration of step (iia) is about one second to about 10 minutes (typically about 10 seconds to about 2 minutes).

In some embodiments, step (iia) (oxidizing step) is conducted using an oxygen plasma under conditions where the flow rate of oxygen supplied to a chamber where the substrate is placed is about one sccm to about 10 slm (typically about 10 sccm to about 500 sccm), wherein an inert gas such as rare gas may be used as a carrier gas or an additive gas, the total flow is about 100 sccm to about 20 slm (typically about 200 sccm to about 2,000 sccm), the temperature of the atmosphere is about 0° C. to about 100° C. (typically about 0° C. to about 50° C.), the pressure is about 10 Pa to about 2,000 Pa (typically about 200 Pa to about 1,000 Pa), the RF power applied to the gas in the chamber is about 10 W to about 2,000 W (typically about 30 W to about 500 W), and the duration of step (iia) is about one second to about 10 minutes (typically about 5 seconds to about 1 minute).

In some embodiments, a method for forming a modified low-k film on a substrate, comprises:
(1) placing a patterned substrate on a lower electrode whose temperature is controlled at about 20° C. in a vacuum environment in a plasma reactor;

(2) supplying a process gas (siloxane, oxidizing gas, and rare gas) to the reactor and controlling the pressure in the reactor at a given pressure (about 200 Pa to about 800 Pa);

(3) generating a plasma by applying RF power (about 10 MHz to about 60 MHz, about 10 W to about 3,000 W) to the reactor;

(4) forming a gap-fill low-k film on the patterned substrate due to reaction of the process gas using the plasma, wherein the gap-fill low-k film contains alcohol, silanol, $H_2O$, etc. and is highly flowable;

(5) after evacuating the reactor, supplying a gas containing organoaminosilane (or organosilazane) (e.g., dimethylaminotrimethylsilane) and controlling the pressure in the reactor at a given pressure (about 0.5 Pa to about 1 ATM), thereby exposing the film to the organoaminosilane gas for a given time period, wherein the organoaminosilane reacts alcohol, silanol, $H_2O$, etc. in the film, forming —O—Si(Me)x (Me is methyl, x is an integer), based on the following reactions (for non-limiting illustrative purposes):

alcohol: $CxHy$—OH+$(CH_3)_3Si$—$N(CH_3)_2$→$CxHy$—O—$Si(CH_3)_3$+$HN(CH_3)_2$;

silanol: $O_3$-Si—OH+$(CH_3)_3Si$—$N(CH_3)_2$→$O_3$—Si—O—$Si(CH_3)_3$+$HN(CH_3)_2$;

$H_2O$: H—OH+$(CH_3)_3Si$—$N(CH_3)_2$→H—O—Si$(CH_3)_3$+$HN(CH_3)_2$;

H—O—$Si(CH_3)_3$+$(CH_3)_3Si$—$N(CH_3)_2$→$(CH_3)_3$—Si—O—$Si(CH_3)_3$+$HN(CH_3)_2$;

(6) transferring the substrate to a UV light reactor which is different from the plasma reactor, and adjusting the temperature of the substrate to about 200° C. to about 450° C. on a heater table of the UV light reactor;

(7) supplying an inert gas such as nitrogen, a reactive gas, or a mixture of these to the UV light reactor and controlling the pressure in the UV light reactor at a given pressure (about 10 Pa to about 12,000 Pa); and (8) irradiating the film on the substrate with UV light for a given time period (about 10 seconds to about 1,200 seconds), thereby curing the film.

In the above, the organoaminosilane reacts alcohol, silanol, $H_2O$, etc. in the film during the organoaminosilane annealing (step (5)) and forms siloxane bonds, thereby reducing shrinkage of the film during the curing (step (8)). However, the siloxane bonds constitute not only non-volatile components but also short-chain volatile components, which are removed from the film under a high heat condition during the curing, thereby causing shrinkage of the film. Thus, after the organoaminosilane annealing, by conducting an oxidizing step wherein the film is exposed to an oxidizing atmosphere, thereby forming silanol (Si—OH), followed by the organoaminosilane annealing, the quantity of Si—O bond components can increase, and short-chain siloxane bond components which are highly volatile can be replaced with long-chain siloxane bond components which have lower volatility, thereby reducing shrinkage of the film during the curing and increasing film strength. The above reactions may be indicated as follows (for non-limiting illustrative purposes):

(a) A methyl group of existing short-chain silane components is changed to a hydroxyl group by reaction with oxygen radical:

—$Si(CH_3)_3$+O*→—$Si(CH_3)_2CH_2$*+OH

—$Si(CH_3)_2CH_2$*+O*→—$Si(CH_3)_2$*+$CH_2O$

—$Si(CH_3)_2$*+OH→—$Si(CH_3)_2OH$;

(b) An organoaminosilane is reacted with the silanol bond, forming a component having a longer-chain oxygen-silicon bond:

—$Si(CH_3)_2OH$+$(CH_3)_3Si$—$N(CH_3)_2$→—$Si(CH_3)_2$—O—$Si(CH_3)_3$.

In view of the above, in some embodiments using an oxidizing step by UV light, a method for forming a modified low-k film on a substrate, comprises:

(1) placing a patterned substrate on a lower electrode whose temperature is controlled at about 20° C. in a vacuum environment in a plasma reactor;

(2) supplying a process gas (siloxane, oxidizing gas, and rare gas) to the reactor and controlling the pressure in the reactor at a given pressure (about 200 Pa to about 800 Pa);

(3) generating a plasma by applying RF power (about 10 MHz to about 60 MHz, about 10 W to about 3,000 W) to the reactor;

(4) forming a gap-fill low-k film on the patterned substrate due to reaction of the process gas using the plasma, wherein the gap-fill low-k film contains alcohol, silanol, $H_2O$, etc. and is highly flowable;

(5) transferring the substrate to a UV light reactor which is different from the plasma reactor, and adjusting the temperature of the substrate to about 25° C. on a heater table of the UV light reactor;

(6) after evacuating the UV light reactor, supplying a gas containing organoaminosilane (e.g., dimethylaminotrimethylsilane) and controlling the pressure in the reactor at a given pressure (about 0.5 Pa to about 1 ATM), thereby exposing the film to the organoaminosilane gas for a given time period, wherein the organoaminosilane reacts alcohol, silanol, $H_2O$, etc. in the film, forming —O—Si(Me)$_3$ (Me is methyl);

(7) stopping the organoaminosilane gas flow, starting supplying an oxygen gas, and irradiating the film with UV light, wherein the wavelength of the UV light is about 200 nm or less, and the UV light irradiation oxidizes the film while generating ozone, thereby oxidizing methyl groups and forming Si—O—Si bonds and Si—OH groups (see reaction formulas (a));

(8) after evacuating the UV light reactor, again supplying a gas containing organoaminosilane (e.g., dimethylaminotrimethylsilane), thereby exposing the film to the organoaminosilane gas, wherein the organoaminosilane reacts silanol (Si—OH) groups in the film, forming Si—O—Si(Me)$_3$ (Me is methyl);

(9) as necessary, repeating steps (7) and (8) once or multiple times;

(10) transferring the substrate to a different UV light reactor, and adjusting the temperature of the substrate to about 200° C. to about 450° C. on a heater table of the UV light reactor;

(11) supplying an inert gas such as nitrogen, a reactive gas, or a mixture of these to the UV light reactor and controlling the pressure in the UV light reactor at a given pressure (about 10 Pa to about 12,000 Pa); and

(12) irradiating the film on the substrate with UV light for a given time period (about 10 seconds to about 1,200 seconds), thereby curing the film.

In some embodiments using an oxidizing step with a ozone generator, a method for forming a modified low-k film on a substrate, wherein steps (1) to (4) are the same as above, comprises:

(5) after evacuating the reactor, supplying a gas containing organoaminosilane (e.g., dimethylaminotrimethylsilane), thereby exposing the film to the organoaminosilane gas for a given time period, wherein the organoaminosilane reacts alcohol, silanol, H$_2$O, etc. in the film, forming —O—Si(Me)$_3$ (Me is methyl);

(6) stopping the organoaminosilane gas flow, starting supplying an ozone generated by an ozone generator to the reactor, thereby oxidizing methyl groups and forming Si—O—Si bonds and Si—OH groups (see reaction formulas (a));

(7) after evacuating the reactor, again supplying a gas containing organoaminosilane (e.g., dimethylaminotrimethylsilane), thereby exposing the film to the organoaminosilane gas, wherein the organoaminosilane reacts silanol (Si—OH) groups in the film, forming Si—O—Si(Me)$_3$ (Me is methyl);

(8) as necessary, repeating steps (6) and (7) once or multiple times;

(9) transferring the substrate to a different UV light reactor, and adjusting the temperature of the substrate to about 200° C. to about 450° C. on a heater table of the UV light reactor;

(10) supplying an inert gas such as nitrogen, a reactive gas, or a mixture of these to the UV light reactor and controlling the pressure in the UV light reactor at a given pressure (about 10 Pa to about 12,000 Pa); and

(11) irradiating the film on the substrate with UV light for a given time period (about 10 seconds to about 1,200 seconds), thereby curing the film.

In some embodiments using an oxidizing step by an oxygen plasma, a method for forming a modified low-k film on a substrate, wherein steps (1) to (5) are the same as above, comprises:

(6) stopping the organoaminosilane gas flow, starting supplying an oxygen gas to the reactor, thereby generating an oxygen plasma using RF power (about 10 MHz to about 60 MHz), wherein RF power, pressure, and duration are controlled, oxidizing methyl groups and forming Si—O—Si bonds and Si—OH groups (see reaction formulas (a));

(7) again supplying a gas containing organoaminosilane (e.g., dimethylaminotrimethylsilane), thereby exposing the film to the organoaminosilane gas, wherein the organoaminosilane reacts silanol (Si—OH) groups in the film, forming Si—O—Si(Me)$_3$ (Me is methyl);

(8) as necessary, repeating steps (6) and (7) once or multiple times;

(9) transferring the substrate to a different UV light reactor, and adjusting the temperature of the substrate to about 200° C. to about 450° C. on a heater table of the UV light reactor;

(10) supplying an inert gas such as nitrogen, a reactive gas, or a mixture of these to the (V light reactor and controlling the pressure in the UV light reactor at a given pressure (about 10 Pa to about 12,000 Pa); and

(11) irradiating the film on the substrate with UV light for a given time period (about 10 seconds to about 1,200 seconds), thereby curing the film.

In another aspect, for assuring stability of film quality, a substrate is processed in clustered chambers for conducting formation of low-k film, annealing, and UV curing, in which the substrate on which a low-k film is formed is transferred continuously to an annealing chamber in an inert gas atmosphere. By this, the substrate is subjected to annealing without being exposed to the air, thereby inhibiting changes of film quality caused by oxidation and moisture absorption. In some embodiments comprising: (i) providing a low-k SiOCH film formed on a substrate by flowable CVD; (ii) exposing the low-k SiOCH film to a gas containing a Si—N bond in its molecule to increase Si—O bonds and/or Si—C bonds in the film; and (iii) curing the low-k SiOCH film obtained in step (ii), step (i) is conducted in a reaction chamber, step (ii) is conducted in an annealing chamber, and step (iii) is conducted in a curing chamber, wherein the reaction chamber, the annealing chamber, and the curing chamber are connected to a common transfer chamber, and the substrate is transferred, without being exposed to the atmosphere, from the reaction chamber to the annealing chamber, and from the annealing chamber to the curing chamber through the common transfer chamber. In the above, constant time management between different processes (Q-time control) can be performed, and thus, changes of film quality due to thermal shrinkage in the chamber can be controlled under the constant time management, thereby producing films with low variations between substrates.

In some embodiments, the annealing chamber is not equipped for plasma treatment, UV treatment, or other treatment using electromagnetic waves, and the curing chamber is not equipped for plasma treatment.

Figure 4:
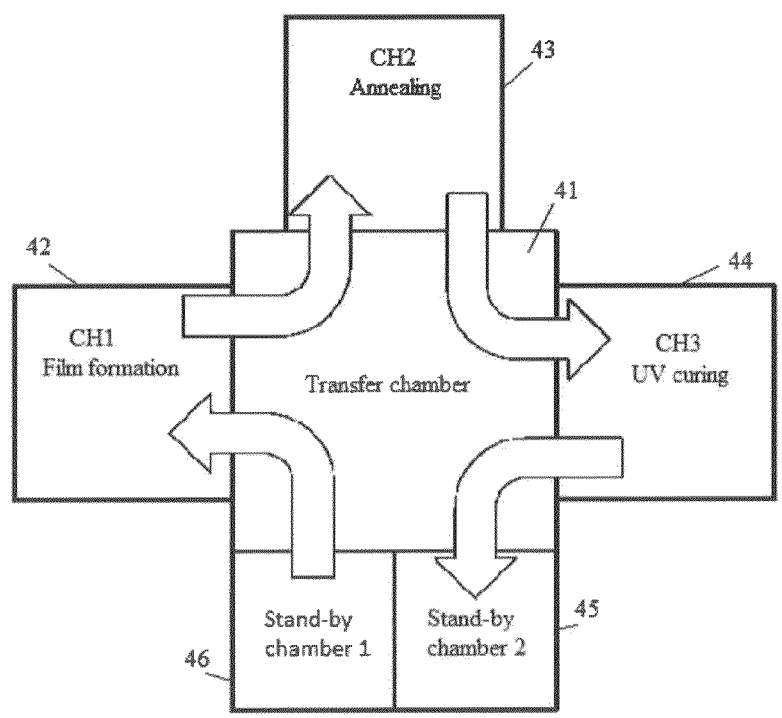
FIG. 4 is a schematic representation of clustered chambers according to an embodiment of the present invention.

FIG. 4 is a schematic representation of clustered chambers according to an embodiment of the present invention. The process sequence using the apparatus shown in FIG. 4 is as follows:

(1) Loading a patterned substrate to a film formation chamber 42 from a wafer stand-by chamber 46 via a transfer chamber 41;

(2) keeping the patterned substrate on a lower electrode whose temperature is controlled at about 20° C. in a vacuum environment in the film formation chamber 42;

(3) supplying a process gas (siloxane, oxidizing gas, and rare gas) to the film formation chamber 42 and controlling the pressure in the chamber at a given pressure (about 200 Pa to about 800 Pa);

(4) generating a plasma by applying RF power (about 10 MHz to about 60 MHz, about 10 W to about 3,000 W) to the interior of the film formation chamber 42;

(5) forming a gap-fill low-k film on the patterned substrate due to reaction of the process gas using the plasma, wherein the gap-fill low-k film contains alcohol, silanol, H$_2$O, etc. and is highly flowable;

(6) transferring the substrate on which the film is formed from the film formation chamber 42 to an annealing chamber 43 via the transfer chamber 41;

(7) adjusting the temperature of the substrate at about 25° C. under a given pressure in the annealing chamber 43;

(8) supplying a gas containing organoaminosilane (or organosilazane) and controlling the pressure in the reactor at a given pressure (about 1 ATM), thereby exposing the film to the organoaminosilane gas, forming —O—Si(Me)x:

(9) transferring the substrate to a curing chamber 44 via the transfer chamber 41;

(10) adjusting the temperature of the substrate to about 200° C. to about 450° C. under a given pressure (about 10 Pa to about 12,000 Pa);

(11) irradiating the film on the substrate with UV light (having a wavelength of about 200 nm or less) in the curing chamber 44 for a given time period (about 10 seconds to about 1,200 seconds);

(12) thereby forming a densified low-k film wherein methyl groups in the film are dissociated and new Si—O—Si bonds are formed; and

(13) returning the substrate having a stabilized low-k film to a wafer stand-by chamber 45 via the transfer chamber 41.

In the above, the substrate is not exposed to the outside atmosphere during the entire processes.

In still another aspect, in some embodiments where the method further comprises, prior to or after step (ii), (iia) oxidizing the low-k SiOCH film provided in step (i), step (iia) is conducted using an oxygen plasma generated in a remote plasma unit. In some embodiments, step (iia) (oxidizing step) is conducted using a remote plasma unit under conditions where the flow rate of oxygen supplied to the remote plasma unit is about 1 sccm to about 5 slm (typically about 50 sccm to about 1500 sccm), wherein an inert gas such as rare gas may be used as a carrier gas or an additive gas, the total flow is about 100 sccm to about 12 slm (typically about 500 sccm to about 8 slm), the temperature of the susceptor is about 0° C. to about 100° C. (typically about 0° C. to about 50° C.), the pressure of the reactor is about 1 Pa to about 12,000 Pa (typically about 100 Pa to about 2,000 Pa), and the duration of step (iia) is about 1 seconds to about 10 minutes (typically about 30 seconds to about 3 minutes).

In some embodiments using an oxidizing step using a remote plasma unit prior to annealing, a method for forming a modified low-k film on a substrate, comprises:

(1) placing a patterned substrate on a lower electrode whose temperature is controlled at about 0° C. to about 25° C. in a vacuum environment in a plasma reactor;

(2) supplying a process gas (siloxane, oxidizing gas, and rare gas) to the reactor and controlling the pressure in the reactor at a given pressure (about 200 Pa to about 800 Pa);

(3) generating a continuous plasma by applying RF power (about 10 MHz to about 60 MHz, about 10 W to about 3,000 W) to the reactor;

(4) forming a gap-fill low-k film on the patterned substrate due to reaction of the process gas using the continuous plasma, wherein the gap-fill low-k film contains alcohol, silanol, $H_2O$, etc. and is highly flowable;

(5) starting supplying an oxygen gas to a remote plasma unit upstream of the reactor so as to supply an oxygen plasma to the reactor, thereby oxidizing methyl groups and forming Si—O—Si bonds and Si—OH groups;

(6) after purging the oxygen from the reactor by replacing it with inert gas or rare gas, supplying a gas containing organoaminosilane (e.g., dimethylaminotrimethylsilane) to the reactor, thereby exposing the film to the organoaminosilane gas, wherein the organoaminosilane reacts alcohol, silanol, $H_2O$, etc. in the film, forming —O—Si(Me)$_3$ (Me is methyl);

(7) transferring the substrate to a different UV light reactor, and adjusting the temperature of the substrate to about 200° C. to about 450° C. on a heater table of the UV light reactor;

(8) supplying an inert gas such as nitrogen, a reactive gas, or a mixture of these to the UV light reactor and controlling the pressure in the UV light reactor at a given pressure (about 10 Pa to about 12,000 Pa); and (9) irradiating the film on the substrate with UV light for a given time period (about 10 seconds to about 1,200 seconds), thereby curing the film.

In some embodiments using an oxidizing step using a remote plasma unit after annealing, a method for forming a modified low-k film on a substrate, wherein steps (1) to (4) and (7) to (9) are the same as in the embodiments using the oxidizing step prior to annealing, comprises:

(5) after evacuating the reactor, supplying a gas containing organoaminosilane (e.g., dimethylaminotrimethylsilane) to the reactor, thereby exposing the film to the organoaminosilane gas, wherein the organoaminosilane reacts alcohol, silanol, $H_2O$, etc. in the film, forming —O—Si(Me)$_3$ (Me is methyl);

(6) after purging the organoaminosilane gas from the reactor by replacing it with inert gas or rare gas, starting supplying an oxygen gas to a remote plasma unit upstream of the reactor so as to supply an oxygen plasma to the reactor, thereby oxidizing methyl groups and forming Si—O—Si bonds and Si—OH groups.

In yet another aspect, step (iii) (i.e., curing) comprises irradiating the low-k SiOCH film with UV light at a temperature of −10° C. to 50° C., typically about 0° C. to about 30° C. ("low-temperature UV-curing"), and then irradiating the low-k SiOCH film with UV light at a temperature of 200° C. to 400° C., typically about 300° C. to about 400° C. ("high-temperature UV-curing"). By conducting the two-step UV-curing, film shrinkage can further be reduced by about 30%, for example, as compared with conventional single-step UV-curing. Further, by conducting the two-step UV-curing, leakage current of the film can be improved by one digit, for example, as compared with conventional single-step UV-curing. Also, by conducting the two-step UV-curing, generation of voids in the film can effectively be suppressed.

In some embodiments, the UV light used for the low-temperature UV-curing has a wavelength of 400 nm or less (typically about 170 nm to about 300 nm) and an illumination intensity of less than about 120 W/cm$^2$ (typically about 25 W/cm$^2$ to about 100 W/cm$^2$). An Xe lamp can preferably be used for this purpose. In some embodiments, the UV light used for the high-temperature UV-curing can have wide ranges of wavelength and an illumination intensity of less than about 150 W/cm$^2$. The high-temperature UV-curing can be conducted using any suitable UV lamp including an Xe lamp and other conventional lamps. In some embodiments, the low-temperature UV-curing is conducted at an illumination intensity which is lower than an illumination intensity used in the high-temperature UV-curing, for a duration (e.g., about 10 seconds to about 600 seconds, typically about 30 seconds to about 180 seconds, depending on the thickness of the film, etc.) which is equal to or longer than a duration of the high-temperature UV-curing.

The above temperatures are measured at a susceptor provided in a UV-curing chamber, wherein the susceptor is equipped with a cooling system. Use of UV light having a wavelength of 400 nm or less can inhibit raising the temperature of a substrate. Both the low-temperature UV-curing and high-temperature UV-curing can be conducted under a pressure of 0 Pa to 1 ATM.

In some embodiments, the low-temperature UV-curing and the high-temperature UV-curing are conducted in the same UV-curing chamber or different UV-curing chambers.

In some embodiments, the patterned substrate includes tungsten wiring. By using any of the disclosed methods, a low-k film can be formed in trenches without voids and thus, wiring patterns can be miniaturized, so that wiring can be constituted by tungsten instead of copper, eliminating the complex damascene method.

The low-temperature UV-curing and the high-temperature UV-curing can be applied to any types of film in combination with any processes so that film shrinkage can be reduced, and can be employed independently of the organoaminosilane annealing in some embodiments, i.e., by using the low-temperature UV-curing and the high-temperature UV-curing even without the annealing, film shrinkage can significantly be reduced as compared with that exhibited when conventional UV-curing is conducted.

Figure 8:
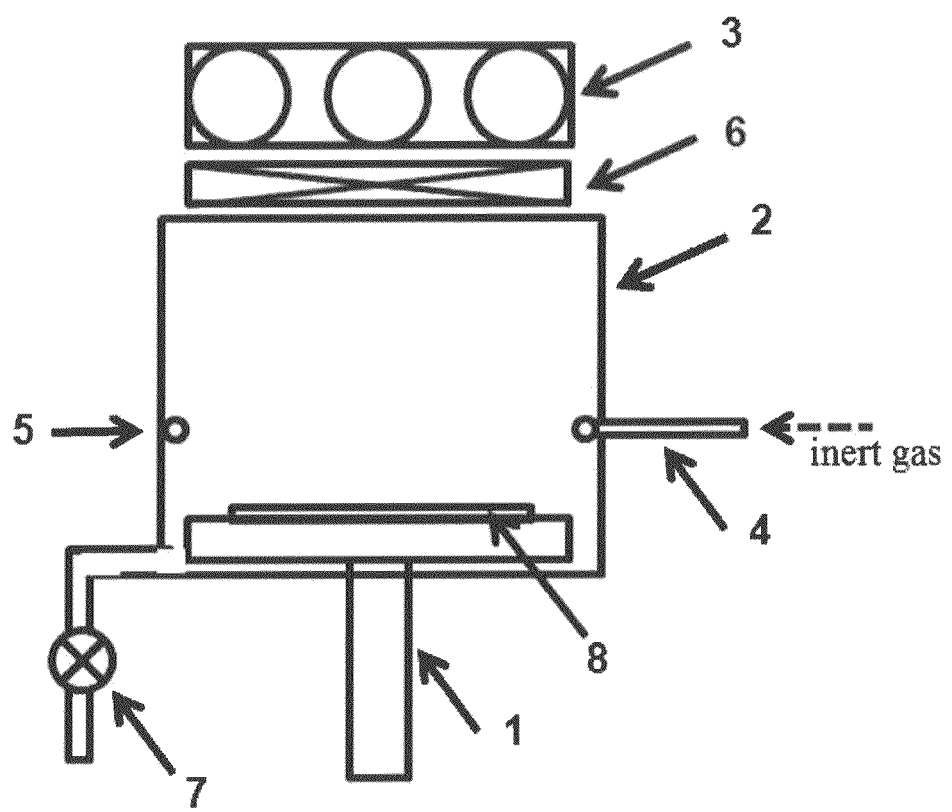
FIG. 8 is a schematic view of a UV light irradiation apparatus usable in an embodiment of the present invention.

FIG. 8 is a schematic view of a UV light irradiation apparatus for conducting the two-step UV-curing in some embodiments of the present invention. First, a substrate 8 is loaded to a susceptor 1 equipped with a cooling system, whose temperature has been adjusted to about 50° C. or less, preferably about 30° C. or less. Next, an inert gas is supplied to a curing chamber 2 via a gas inlet pipe 4 and a gas distribution nozzle 5, wherein the pressure of the curing chamber 2 is adjusted to about 100 Pa to about 1 ATM, preferably about 800 Pa to about 1,300 Pa, using a pressure adjusting valve 7. Next, a shutter 6, which isolates the curing chamber 2 from a UV-curing unit 3, opens so as to emit UV light from the UV-curing unit 3 to the substrate 8, thereby conducting the low-temperature UV-curing. Thereafter, the temperature of the susceptor 1 is adjusted to about 300° C. to about 400° C., preferably about 380° C., and then, the substrate 8 is loaded to the susceptor 1, followed by the high-temperature UV-curing in a manner substantially similar to the low-temperature UV-curing.

The low-temperature UV-curing and the high-temperature UV-curing can be conducted as two discrete steps, i.e., after the low-temperature UV-curing, the substrate is unloaded and the temperature of the susceptor is raised, and then, the substrate is reloaded for the high-temperature UV-curing. Thus, these two steps of UV-curing can be conducted in different UV-curing chambers. Alternatively, the low-temperature UV-curing and the high-temperature UV-curing can continuously be conducted, i.e., without unloading and reloading the substrate, wherein changes of temperature from the set temperature for the low-temperature UV-curing to the set temperature for the high-temperature UV-curing can be continuous or in steps.

EXAMPLES

In the following examples where conditions and/or structures are not specified, the skilled artisan in the art can readily provide such conditions and/or structures, in view of the present disclosure, as a matter of routine experimentation. A skilled artisan will appreciate that the apparatus used in the examples included one or more controller(s) (not shown) programmed or otherwise configured to cause the deposition and reactor cleaning processes described elsewhere herein to be conducted. The controller(s) were communicated with the various power sources, heating systems, pumps, robotics and gas flow controllers or valves of the reactor, as will be appreciated by the skilled artisan.

Example 1

In this example, a carbon-doped silicon oxide film was formed on a substrate as follows:

(1) placing a patterned substrate on a lower electrode whose temperature was controlled at about 20° C. in a vacuum environment in a plasma reactor;

(2) supplying about 0.3 g/min of siloxane (diethoxymethylsilane), about 40 sccm of oxidizing gas (oxygen), and about 300 sccm of rare gas (He) to the reactor and controlling the pressure in the reactor at about 300 Pa;

(3) generating a plasma by applying RF power (about 13 MHz, about 100 W) to the reactor;

(4) forming a gap-fill low-k film on the patterned substrate due to reaction of the gases using the plasma;

(5) after evacuating the reactor, supplying about 100 sccm of a gas containing about 30% of dimethylaminotrimethylsilane in rare gas (Ar) and controlling the pressure in the reactor at about 1,200 Pa, thereby exposing the film to the dimethylaminotrimethylsilane gas for 2 minutes at a temperature of about 25° C.;

(6) transferring the substrate to a UV light reactor which is different from the plasma reactor, and adjusting the temperature of the substrate to about 380° C. on a heater table of the UV light reactor;

(7) supplying an inert gas ($N_2$) to the UV light reactor and controlling the pressure in the UV light reactor at about 1,200 Pa; and (8) irradiating the film on the substrate with UV light for about 90 seconds), thereby curing the film which had a thickness of about 200 nm.

Another carbon-doped silicon oxide film was formed on a substrate by the method which was the same as above except that step (5) (which is referred to as "organoaminosilane annealing") was not conducted.

FIG. 1 shows Fourier Transform Infrared (FTIR) spectra of the thus-obtained carbon-doped silicon oxide film formed with the organoaminosilane annealing (solid line) and the carbon-doped silicon oxide film formed without the organoaminosilane annealing (broken line). As shown in FIG. 1, by conducting the organoaminosilane annealing, all hydroxyl groups were substantially completely removed from the film (to a substantially undetectable level). As is evident from the above, the introduced organoaminosilane penetrated deeply in the film, improving the film quality of the entire film. Also, by conducting the organoaminosilane annealing, the peak corresponding to Si—O bonds increased, indicating that formation of Si—O skeleton was promoted. Further, by conducting the organoaminosilane annealing, the peak corresponding to Si-$Me_3$ bonds increased, indicating that the film matrix was reacted with the organoaminosilane.

Figure 2:
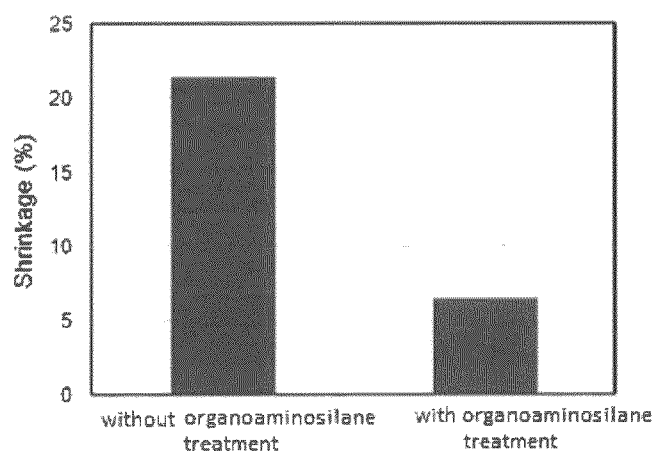
FIG. 2 is a graph illustrating shrinkage (%) by curing of a carbon-doped silicon oxide film formed with organoaminosilane annealing according to an embodiment of the present invention and a carbon-doped silicon oxide film formed without organoaminosilane annealing.

FIG. 2 is a graph illustrating shrinkage (%) by curing of the carbon-doped silicon oxide film formed with the organoaminosilane annealing and the carbon-doped silicon oxide film formed without the organoaminosilane annealing. As shown in FIG. 2, the shrinkage (about 6%) by curing of the film with the organoaminosilane annealing was less than 10% which is significantly lower than that (21%) of the film without the annealing.

Figure 3:
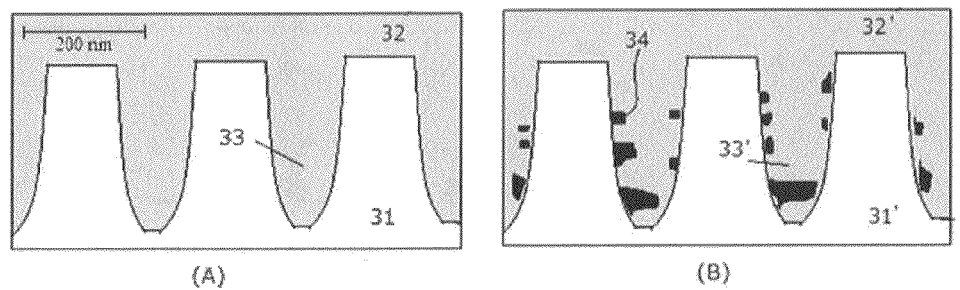
FIG. 3 shows: (a) a schematic illustration of a scanning electron microscope (SEM) photograph of a cross-sectional view of a gap-fill silicon oxide film formed on a patterned silicon substrate with organoaminosilane annealing according to an embodiment of the present invention, and (b) a schematic illustration of a scanning electron microscope (SEM) photograph of a cross-sectional view of a gap-fill silicon oxide film formed on a patterned silicon substrate without organoaminosilane annealing.

FIG. 3 shows: (a) a schematic illustration of a scanning electron microscope (SEM) photograph of a cross-sectional view of the gap-fill silicon oxide film 32 formed in trenches 33 of the patterned silicon substrate 31 with the organoaminosilane annealing, and (b) a schematic illustration of a scanning electron microscope (SEM) photograph of a cross-sectional view of the gap-fill silicon oxide film 32' formed in trenches 33 of the patterned silicon substrate 31' without the organoaminosilane annealing. Both illustrations show the films after being cured. As shown in FIG. 3, without the organoaminosilane annealing, many voids 34 (having a size of, e.g., about 20 nm or greater) formed due to shrinkage were observed, whereas with the organoaminosilane annealing, substantially no voids formed due to shrinkage were observed.

Example 2

Multiple substrates were continuously processed under conditions which were substantially similar to those in Example 1, using the clustered apparatus illustrated in FIG. 4, wherein each substrate was transferred between the chambers via the transfer chamber 41 so that the substrate was not exposed to the outside atmosphere. While transferring the substrates between the chambers, the pressure of the transfer chamber was adjusted at a pressure (100 to 1,500 mTorr) higher than that in the film formation chamber using nitrogen gas. As a comparative example, multiple substrates were processed under the same conditions except that the substrates were processed by batch at each chamber (25 wafers constituted one batch or lot), wherein the transfer chamber was not used so that the substrates were exposed to the outside atmosphere until all the substrates of the lot were processed.

Figure 5:
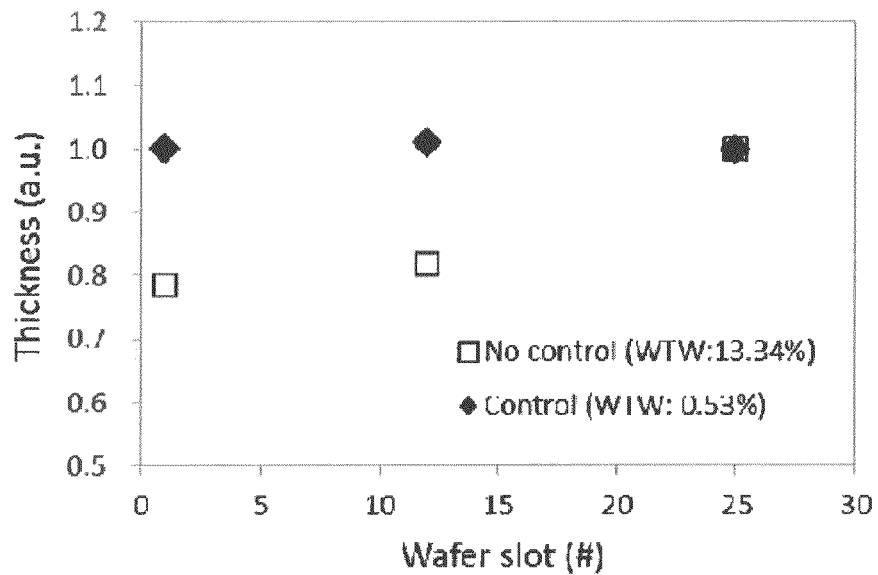
FIG. 5 is a graph showing the relationship between thickness (a.u.) of cured film and cumulative number of processed substrates from the same lot using the transfer chamber according to an embodiment of the present invention (♦), and without using the transfer chamber (□).

FIG. 5 is a graph showing the relationship between thickness (a.u.) of cured film and cumulative number of processed substrates from the same lot using the transfer chamber (♦), and without using the transfer chamber (□). This graph represents film quality stability. As shown in FIG. 5, without the transfer chamber, because after the film formation the substrates stored in earlier slots of the lot were standing by and exposed to the outside atmosphere for a period longer than the substrates stored in later slots of the lot until all of the substrates were complete with the film formation, the films of the substrates stored in the earlier slots caused film shrinkage, causing greater variations in thickness among the substrates (WTW, wafer to wafer variations, was 13.34%). In contrast, when the substrates were transferred via the transfer chamber, the substrates were not exposed to the outside atmosphere, and substantially no variations in thickness were observed among the substrates (WTW was 0.53%).

Figure 6:
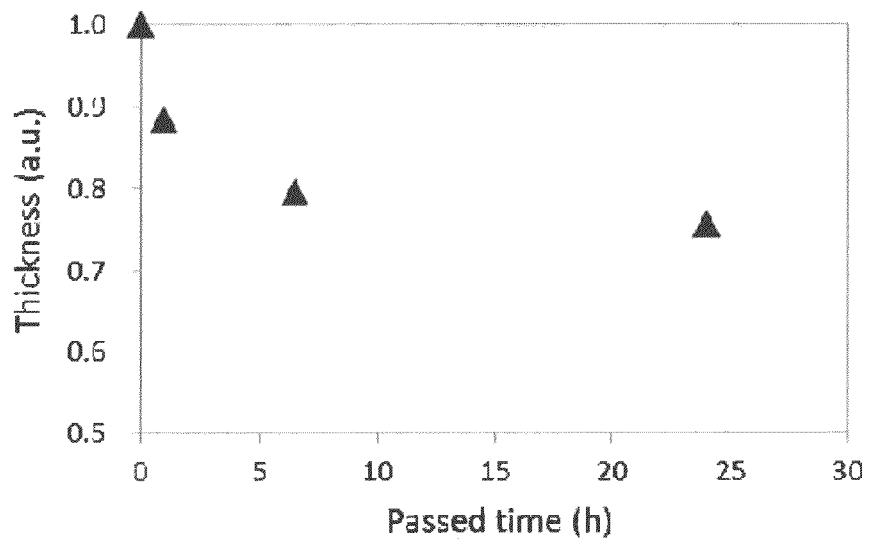
FIG. 6 is a graph showing the relationship between thickness (a.u.) of as-deposited low-k SiOCH film by flowable CVD and exposure time of the processed substrate.

FIG. 6 is a graph showing the relationship between thickness (a.u.) of gap-sill as-deposited low-k film and exposure time (in hours) of the processed substrate. As shown in FIG. 6, at the one-hour point after the film formation, the thickness of the film was already decreased by more than 10%, and at the 24-hour point after the film formation, the thickness of the film was decreased by about 22%, indicating that components having low boiling points such as alcohol or hydrocarbon contained in the film immediately after the film formation, moved as degas components to the outside atmosphere, thereby causing the shrinkage of the film while being exposed to the outside atmosphere. By conducting annealing and curing of the film, exposure of which to the outside atmosphere immediately after the film formation is completely avoided, variations in thickness can further be suppressed as shown in FIG. 5.

Example 3

In this example, a carbon-doped silicon oxide film was formed on a substrate as follows:

(1) placing a patterned substrate on a lower electrode whose temperature was controlled at about 20° C. in a vacuum environment in a plasma reactor;

(2) supplying about 0.3 g/min of siloxane (diethoxymethylsilane), about 40 sccm of oxidizing gas (oxygen), and about 300 sccm of rare gas (He) to the reactor and controlling the pressure in the reactor at about 300 Pa;

(3) generating a plasma by applying RF power (about 13 MHz, about 100 W) to the reactor;

(4) forming a gap-fill low-k film on the patterned substrate due to reaction of the gases using the plasma;

(5) starting supplying about 1,000 sccm of oxygen ($O_2$) and about 5,000 sccm of rare gas (Ar) to a remote plasma unit upstream of the reactor so as to supply an oxygen plasma to the reactor while controlling the pressure in the reactor at about 1,000 Pa;

(6) after evacuating the reactor, supplying about 100 sccm of a gas containing about 30% of dimethylaminotrimethylsilane in rare gas (Ar) and controlling the pressure in the reactor at about 1,200 Pa, thereby exposing the film to the dimethylaminotrimethylsilane gas for 2 minutes at a temperature of about 25° C.;

(7) transferring the substrate to a different UV light reactor, and adjusting the temperature of the substrate to about 30° C. on a heater table of the UV light reactor;

(8) supplying an inert gas ($N_2$) to the UV light reactor and controlling the pressure in the UV light reactor at a given pressure (about 1 ATM); and (9) irradiating the film on the substrate with UV light for about 180 seconds);

(10) transferring the substrate to a different UV light reactor, and adjusting the temperature of the substrate to about 380° C. on a heater table of the UV light reactor;

(11) supplying an inert gas ($N_2$) to the UV light reactor and controlling the pressure in the UV light reactor at a given pressure (about 1 ATM); and

(12) irradiating the film on the substrate with UV light for about 60 seconds), thereby curing the film which had a thickness of about 200 nm.

A scanning electron microscope (SEM) photograph of a cross-sectional view of the gap-fill silicon oxide film formed in trenches of the patterned silicon substrate was taken to check if the film had voids in trenches. Similar to that shown in (A) of FIG. 3, with the oxidization and the organoaminosilane annealing, it was confirmed that substantially no voids formed due to shrinkage were observed.

Figure 7:
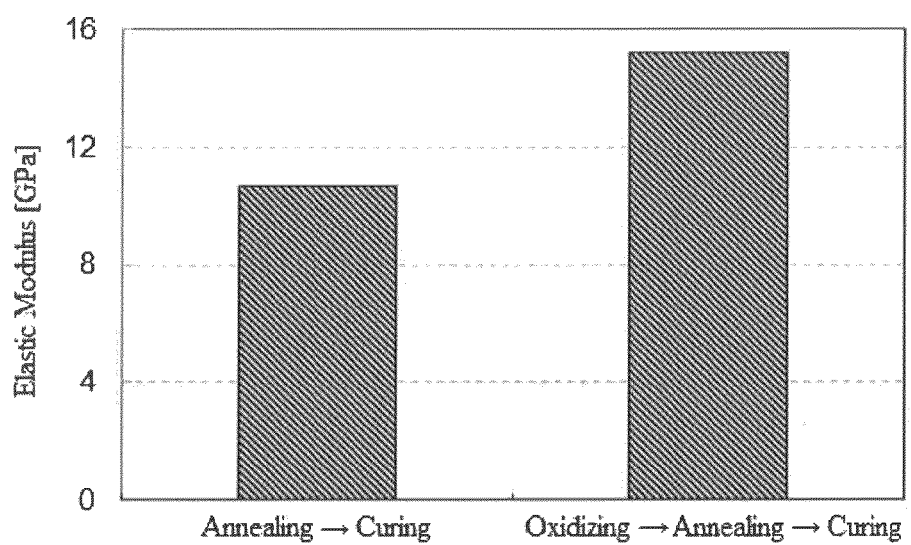
FIG. 7 is a graph showing elastic modulus of films according to an embodiment of the present invention where an oxidizing step is conducted prior to organoaminosilane annealing, and another embodiment of the present invention where no oxidizing step is conducted.

A film was also formed under the same conditions except that oxidization was not performed. Elastic modulus of each film was measured. FIG. 7 is a graph showing elastic modulus of each film. As shown in FIG. 7, by adding the oxidizing step prior to the organoaminosilane annealing, the elastic modulus of the film was increased by about 50% to about 15 GPa.

Reference Example 1

Films were formed on bare substrates under conditions which were similar to those in Example 1 without annealing. The films were then subjected to low-temperature UV-curing using the apparatus illustrated in FIG. 8 under the conditions shown in Table 1:

TABLE 1

| Low-temperature UV-curing | |
| --- | --- |
| Substrate temperature | room temperature |
| Treatment pressure | 1,200 Pa |
| $N_2$ flow rate | 4 SLM |
| Gap (between the shutter and the susceptor) | 38 mm |
| Duration | 90 seconds |

Continuously, high-temperature UV-curing was conducted under the conditions shown in Table 2:

TABLE 2

| Low-temperature UV-curing | |
| --- | --- |
| Substrate temperature | 380° C. |
| Treatment pressure | 665 Pa |
| $N_2$ flow rate | 4 SLM |
| Gap (between the shutter and the susceptor) | 38 mm |
| Duration | 60 seconds |

Reference Example 2

Films were formed on bare substrates under conditions which were the same as to those for the high-temperature UV-curing in Reference Example 1, but without the low-temperature UV-curing.

Figure 9:
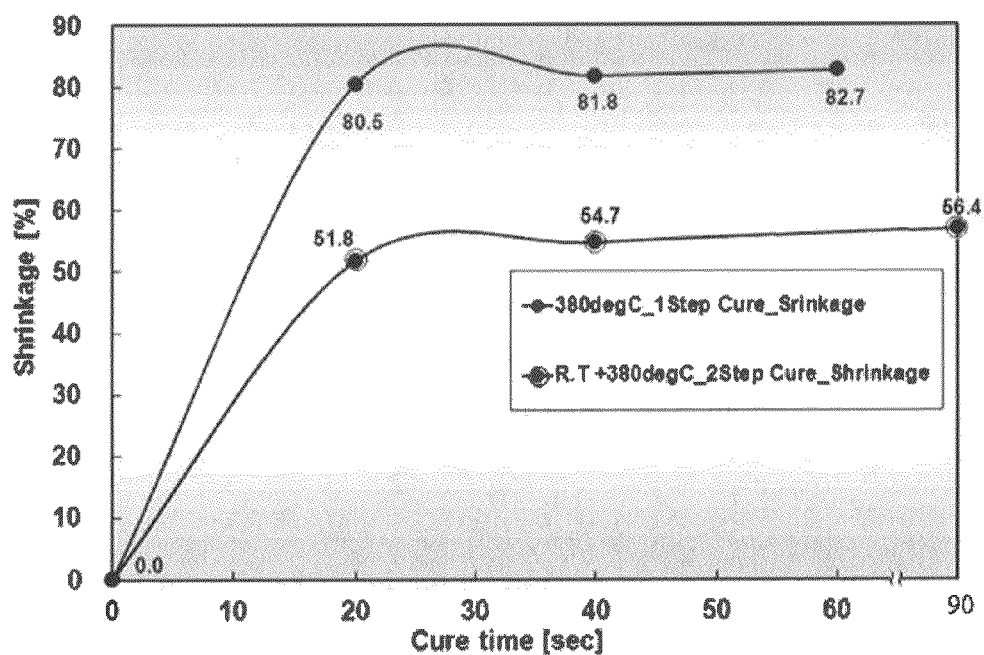
FIG. 9 is a graph showing the relationship between shrinkage (%) and cure time (seconds) according to a reference embodiment.

FIG. 9 is a graph showing the relationship between shrinkage (%) and cure time (seconds) (a line shown with dots in circles: Reference Example 1; a line shown with dots: Reference Example 2). As shown in FIG. 9, the shrinkage of the film obtained by the two-step UV-curing was 56.4%, whereas the shrinkage of the film obtained by the single-step UV-curing was 82.7%, indicating that the two-step UV-curing can provide a film having low film shrinkage.

Figure 10:
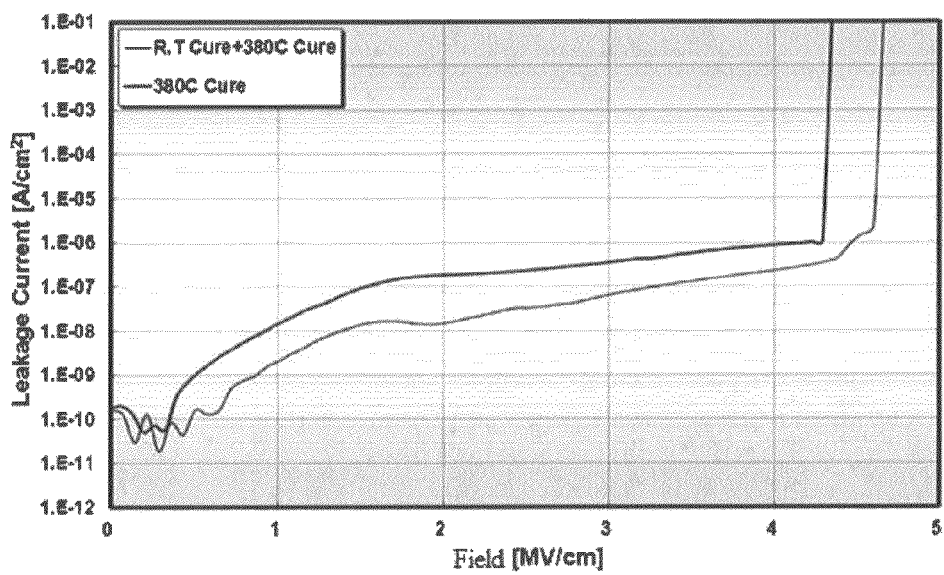
FIG. 10 is a graph showing the relationship between leakage current ($A/cm^2$) and electric field (MV/cm) according to reference embodiments.

As shown in FIG. 10, the leakage current of the film obtained by the two-step UV-curing (1.6E-8 A/$cm^2$@2 MV/cm) was significantly lower than that obtained by the single-step UV-curing (1.4E-7 A/$cm^2$@2 MV/cm). Further, the dielectric constant and mechanical strength of the film obtained by the two-step UV-curing were 2.86 and 6.6 GPa, respectively, whereas the dielectric constant and mechanical strength of the film obtained by the single-step UV-curing were 2.88 and 6.0 GPa, respectively, indicating that the two-step UV-curing can provide films with good film quality.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for forming a modified low-k SiOCH film on a substrate, comprising:
   (i) providing a low-k SiOCH film formed on a substrate by flowable CVD;
   (ii) exposing the low-k SiOCH film to a gas containing a Si—N bond in its molecule without applying electromagnetic energy to increase Si—O bonds and/or Si—C bonds in the film; and
   (iii) curing the low-k SiOCH film obtained in step (ii).

2. The method according to claim 1, further comprising, prior to or after step (ii), (iia) oxidizing the low-k SiOCH film provided in step (i).

3. The method according to claim 2, wherein steps (iia) and (ii) are repeated once or multiple times.

4. The method according to claim 2, wherein step (iia) is conducted using an oxygen plasma generated in a remote plasma unit.

5. The method according to claim 1, wherein step (iii) comprises irradiating the low-k SiOCH film with UV light.

6. The method according to claim 1, wherein the gas containing a Si—N bond is an organoaminosilane.

7. The method according to claim 6, wherein the organoaminosilane is one or more compounds selected from the group consisting of bisdiethylamino silane (BDEAS), bisdiethylamino methylsilane (BDEAMS), bisdiethylamino dimethylsilane (BDEADMS), bisdimethylaminosilane (BDMAS), bisdimethylamino methylsilane (BDMADMS), bisdimethylamino dimethylsilane (BDMADMS), bistert-butylaminosilane (BTBAS), dimethylamino trimethylsilane (DMATMS), dimethylamino dimethylsilane (DMADMS), diethylamino trimethylsilane (DEATMS), diethylamino dimethylsilane (DEADMS), tert-butylaminosilane (TBAS), tert-butylamino trimethylsilane (TBATMS), disec-butylaminosilane (DSBAS), trisdimethylaminosilane (TDMAS), trisdimethylaminomethylsilane (TDMAMS), bistrimethylsilylamine (BTMSA), bistrimethylsilylmethylamine (BTMSMA), bisdimethylsilylamine (BDMSA), bisdimethylsilylmethylamine (BDMSMA), tristrimethylsilylamine (TTMSA), and trisdimethylsilylamine (TDMSA).

8. The method according to claim 1, wherein steps (i) and (ii) are conducted continuously in a same chamber.

9. The method according to claim 1, wherein step (i) is conducted in a reaction chamber, step (ii) is conducted in an annealing chamber, and step (iii) is conducted in a curing chamber, wherein the reaction chamber, the annealing chamber, and the curing chamber are connected to a common transfer chamber, and the substrate is transferred, without being exposed to the atmosphere, from the reaction chamber to the annealing chamber, and from the annealing chamber to the curing chamber through the common transfer chamber.

10. The method according to claim 8, wherein the annealing chamber is not equipped for treatment using electromagnetic waves, and the curing chamber is not equipped for plasma treatment.

11. The method according to claim 1, further comprising, after step (ii), (iib) oxidizing the low-k SiOCH film provided in step (i).

12. The method according to claim 1, wherein step (iii) comprises irradiating the low-k SiOCH film with UV light at a temperature of −10° C. to 50° C., and then irradiating the low-k SiOCH film with UV light at a temperature of 200° C. to 450° C.

13. The method according to claim 12, wherein the UV light used at a temperature of −10° C. to 50° C. has a wavelength of 400 nm or less.

14. The method according to claim 12, wherein the UV light irradiation at a temperature of −10° C. to 50° C. is conducted at an illumination intensity which is lower than an illumination intensity used in the UV light irradiation at a temperature of 200° C. to 450° C., for a duration which is equal to or longer than a duration of the UV light irradiation at a temperature of 200° C. to 450° C.

15. The method according to claim 1, wherein the patterned substrate includes tungsten wiring.

* * * * *